United States Patent
Kim et al.

(10) Patent No.: US 9,953,945 B2
(45) Date of Patent: Apr. 24, 2018

(54) ADHESIVE RESIN COMPOSTITION FOR BONDING SEMICONDUCTORS AND ADHESIVE FILM FOR SEMICONDUCTORS

(71) Applicant: LG CHEM, LTD., Seoul (KR)

(72) Inventors: Hee Jung Kim, Daejeon (KR); Jung Hak Kim, Daejeon (KR); Se Ra Kim, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 65 days.

(21) Appl. No.: 15/030,525

(22) PCT Filed: Nov. 17, 2015

(86) PCT No.: PCT/KR2015/012343
§ 371 (c)(1),
(2) Date: Apr. 19, 2016

(87) PCT Pub. No.: WO2016/080731
PCT Pub. Date: May 26, 2016

(65) Prior Publication Data
US 2016/0336290 A1 Nov. 17, 2016

(30) Foreign Application Priority Data

Nov. 17, 2014 (KR) .......... 10-2014-0160178
Nov. 16, 2015 (KR) .......... 10-2015-0160321

(51) Int. Cl.
C09J 133/04 (2006.01)
C09J 7/02 (2006.01)
H01L 23/00 (2006.01)
C09J 133/14 (2006.01)
C09J 133/06 (2006.01)
C09J 7/04 (2006.01)
C09J 5/00 (2006.01)

(52) U.S. Cl.
CPC ............... *H01L 24/29* (2013.01); *C09J 5/00* (2013.01); *C09J 7/0246* (2013.01); *C09J 7/043* (2013.01); *C09J 133/068* (2013.01); *C09J 133/14* (2013.01); *C08L 2201/08* (2013.01); *C08L 2201/52* (2013.01); *C08L 2203/16* (2013.01); *C08L 2203/20* (2013.01); *C08L 2205/03* (2013.01); *C09J 2201/36* (2013.01); *C09J 2203/326* (2013.01); *C09J 2205/302* (2013.01); *C09J 2205/31* (2013.01); *C09J 2433/00* (2013.01); *C09J 2463/00* (2013.01); *H01L 2224/2919* (2013.01); *H01L 2924/066* (2013.01); *H01L 2924/0635* (2013.01); *H01L 2924/0665* (2013.01); *H01L 2924/0675* (2013.01)

(58) Field of Classification Search
CPC ..................................................... C09J 133/068
See application file for complete search history.

(56) References Cited

U.S. PATENT DOCUMENTS

| 2008/0063871 A1 | 3/2008 | Jung et al. | |
| 2010/0025094 A1* | 2/2010 | Tamiya | C08G 59/30 |
| | | | 174/259 |
| 2014/0010979 A1* | 1/2014 | Tomioka | C08J 5/24 |
| | | | 428/35.7 |
| 2015/0225613 A1* | 8/2015 | Wakayama | C09J 7/0239 |
| | | | 438/113 |

FOREIGN PATENT DOCUMENTS

| JP | 2002-212536 A | 7/2002 |
| JP | 2005281553 | * 10/2005 |
| JP | 4319108 B2 | 8/2009 |
| JP | 2010-254763 A | 11/2010 |
| JP | 4976481 B2 | 7/2012 |
| JP | 5009752 B2 | 8/2012 |
| JP | 5549106 B2 | 7/2014 |
| KR | 10-2004-0029939 A | 4/2004 |
| KR | 10-2008-0023638 A | 3/2008 |
| KR | 10-2008-0096991 A | 11/2008 |
| KR | 10-1023241 B1 | 3/2011 |
| KR | 10-2012-0067195 A | 6/2012 |

(Continued)

OTHER PUBLICATIONS

JER Epoxy Resin Catalog; Mitsubishi Chemicals; (2016).*
Epoxy Resins, Reactive Flame Retardants, Hardeners 13$^{th}$ edition Nippon Kayaku; no date, pp. 1-18.*
Phenolite Novolac Resins DIC Corporation; no date.*

*Primary Examiner* — David J Buttner
(74) *Attorney, Agent, or Firm* — Rothwell, Figg, Ernst & Manbeck, P.C.

(57) ABSTRACT

The present invention relates to an adhesive resin composition for bonding semiconductors, including: a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein the weight ratio of the (meth)acrylate-based resin is 0.48 to 0.65 relative to the total weight of the (meth)acrylate-based resin, the epoxy resin, and the phenol resin, an adhesive film for semiconductors obtained from the resin composition, a dicing die-bonding film including an adhesive layer that includes the adhesive film for semiconductors, a semiconductor wafer including the dicing die-bonding film, and a dicing method for the semiconductor wafer using the dicing die-bonding film.

20 Claims, No Drawings

(56) References Cited

FOREIGN PATENT DOCUMENTS

| KR | 10-1248008 B1 | | 3/2013 |
|----|---------------|---|--------|
| KR | 10-1269196 B1 | | 5/2013 |
| WO | 2012/081771 A1 | | 6/2012 |
| WO | 2012/173325 A1 | | 12/2012 |
| WO | WO-20014/021450 | * | 2/2014 |

* cited by examiner

ND ADHESIVE RESIN COMPOSITION FOR
BONDING SEMICONDUCTORS AND
ADHESIVE FILM FOR SEMICONDUCTORS

CROSS-REFERENCE TO RELATED APPLICATION(S)

This application is a 35 U.S.C. § 371 National Phase Entry application from PCT/KR/2015/012343, filed on Nov. 17, 2015, and designating the United States, which claims priority under 35 U.S.C. § 119 to Korean Patent Application No. 10-2014-0160178 filed on Nov. 17, 2014 and Korean Patent Application No. 10-2015-0160321 filed on Nov. 16, 2015 with the Korean Intellectual Property Office, the disclosures of which are incorporated herein by reference in their entirety.

TECHNICAL FIELD

The present invention relates to an adhesive resin composition for bonding semiconductors and an adhesive film for semiconductors, and more specifically to an adhesive resin composition for bonding semiconductors and an adhesive film for semiconductors that has excellent impact resistance as well as a high mechanical property and heat resistance, and can also achieve high adhesive strength when used for adhesion of semiconductor devices having a fine thickness.

BACKGROUND OF ART

Recently, as the tendency toward miniaturization, high functionalization, and capacity enlargement of electronic equipment has been expanding and the need for densification and high integration of the semiconductor package has rapidly increased, the size of semiconductor chips becoming larger and larger. In terms of improvement of integration degree, the stack package method for laminating chips in multi-stages has gradually increased.

With the recent development trend of semiconductor packaging, miniaturization, thinning, and high performance of the semiconductor have proceeded rapidly. In addition, for the purpose of capacity enlargement of a package, the thickness of the semiconductor wafer is becoming very thin to less than 100 μm so that more chips can be laminated in the same package. Recently, the thickness of the semiconductor wafer has become extremely thin to less than 20 μm.

Thus, when manufacturing a package wherein the thickness of the semiconductor chip and the interlayer adhesive film is 20 μm or less, thinning of the adhesive film is required, whereby conventional manufacturing companies have provided an adhesive film not including inorganic particles.

Looking at the manufacturing process of the package, a semiconductor chip is laminated and then is subjected to a gold wire bonding process in order to conduct electricity.

In this case, due to impacts applied to chips during the wire bonding process, the semiconductor chips are easily cracked or damaged, whereby there may be a problem in the electronic properties after package assembling.

Furthermore, with the thinning of chips, the amount of impact applied to chips during wire bonding is larger. In order to prevent this, an adhesive film which is attached to the semiconductor chips needs to have impact resistance with respect to an impact applied from the outside, thereby protecting the chips.

DETAILED DESCRIPTION OF THE INVENTION

Technical Problem

It is an object of the present invention to provide an adhesive resin composition for bonding semiconductors that has excellent impact resistance as well as a high mechanical property and heat resistance, and that can also achieve high adhesive strength when used for the adhesion of semiconductor devices having a fine thickness.

It is another object of the present invention to provide an adhesive film for bonding semiconductors that has excellent impact resistance as well as a high mechanical property and heat resistance, and that can also achieve high adhesive strength when used for the adhesion of semiconductor devices having a fine thickness.

It is still another object of the present invention to provide a dicing die bonding film that can have excellent impact resistance as well as a high mechanical property and heat resistance, achieve high adhesive strength when used for the adhesion of semiconductor devices having a fine thickness, and minimize the occurrence of burrs during a dicing step of a semiconductor wafer, thereby preventing contamination of semiconductor chips and improving the reliability and lifetime of semiconductor chips.

It is a further object of the present invention to provide a dicing method for semiconductor wafers using a dicing die bonding film.

Technical Solution

There is provided an adhesive resin composition for bonding semiconductors, including: a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein a weight ratio of the (meth)acrylate-based resin is 0.48 to 0.65 relative to a total weight of the (meth)acrylate-based resin, the epoxy resin, and the phenol resin.

There is also provided an adhesive film for semiconductors including: a cross-linking bond between two or more selected from the group consisting of a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein the weight ratio of the (meth)acrylate-based resin is 0.48 to 0.65 relative to the total weight of the (meth)acrylate-based resin, the epoxy resin, and the phenol resin.

There is also provided a dicing die bonding film including: a base film; a pressure-sensitive adhesive layer that is formed on the base film; and an adhesive layer that is formed on the pressure-sensitive adhesive layer and includes the adhesive film for semiconductors.

There is also provided a semiconductor wafer in which an adhesive layer of the dicing die-bonding film is attached to one surface of the wafer, and the base film of the dicing die-bonding film is fixed to a wafer ring frame.

Further, There is also provided a dicing method for semiconductor wafers including: a pretreatment step of completely dividing or partially dividing a semiconductor wafer including a dicing die-bonding film, and a wafer laminated on at least one surface of the dicing die-bonding film; a step of expanding the semiconductor wafer after the pretreatment step; and a step of irradiating ultraviolet light to the base film of the expanded semiconductor wafer and picking up individual chips separated by dividing the semiconductor wafer.

Hereinafter, in accordance with specific embodiments of the invention, an adhesive resin composition for bonding semiconductors, an adhesive film for semiconductors, a dicing die bonding film, a semiconductor wafer, and a dicing method for the semiconductor wafer will be described in more detail.

The adhesive resin composition for bonding semiconductors and an adhesive film for semiconductor packages refers to a resin composition and an adhesive film which are used for the attachment or adhesion of semiconductor components or chips, respectively.

Specifically, an adhesive resin composition for bonding semiconductors and an adhesive film for semiconductor packages refers to an adhesive resin composition and an adhesive film which are used when attaching chips onto a circuit board or a lower chip by the die bonding method, after completion of dicing during the manufacturing process of the semiconductor package. For example, they refer to an adhesive resin composition or an adhesive film which can be used in the multi-chip package method of laminating a plurality of chips by an adhesive and electrically connecting the upper and lower chips by using wire bonding, or in the wafer level stack package method of forming a through-silicon via (TSV) on the wafer on which a circuit is formed, filling it with an energizing material, and directly electrically connecting between layers.

Further, as used herein, the (meth)acrylate refers to including both acrylates and methacrylates.

According to one embodiment of the invention, an adhesive resin composition for bonding semiconductors may be provided, including: a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein the weight ratio of the (meth)acrylate-based resin is 0.48 to 0.65 relative to the total weight of the (meth)acrylate-based resin, the epoxy resin, and the phenol resin.

The present inventors found through numerous experiments that, when using an adhesive resin composition including: a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein the content of the (meth)acrylate-based resin is defined by a specific ratio, the adhesive resin composition has excellent impact resistance as well as a high mechanical property and thermal resistance, and can also achieve high adhesive strength when used for the adhesion of semiconductor devices having a fine thickness. The present invention has been completed based on such a finding.

That is, the resin composition according to one embodiment of the invention can be used for the adhesion of semiconductors, for the adhesion of components included in semiconductors, or for the adhesion of semiconductor packages, and can provide an adhesive film for semiconductors and an adhesive film for semiconductor packages capable of securing high impact resistance when ultra thin wafers are laminated in multi-stages and improving electrical properties after manufacturing of the semiconductor.

As described above, the (meth)acrylate-based resin included in the adhesive resin composition for bonding semiconductors can include more than 17% by weight, or 18 to 35% by weight, or 18 to 25% by weight of (meth)acrylate-based repeating units having an introduced epoxy-based functional groups in the total repeating units or segments of the polymer.

The (meth)acrylate-based resin including more than 17% by weight of (meth)acrylate-based repeating units having an introduced epoxy-based functional group enables the components included in the adhesive resin composition for bonding semiconductors to connect with each other, and secure a higher curing degree. In addition, the adhesive film formed by curing the adhesive resin composition for bonding semiconductors can secure sufficient mechanical properties.

Specifically, as the (meth)acrylate-based repeating units having an introduced epoxy-based functional groups in the total repeating units of the (meth)acrylate-based resin includes more than 17% by weight, or 18 to 35% by weight, or 18 to 25% by weight, the adhesive resin composition for bonding semiconductors can form more crosslinking structures after curing, and improve compatibility between the (meth)acrylate-based resin and the epoxy resin having a softening point of more than 70° C. Therefore, the finally prepared adhesive film can have improved mechanical and physical properties, heat resistance, and impact resistance while having more uniform physical and appearance properties.

The epoxy-based functional group may have one or more substitutions in the repeating units constituting the main chain of the (meth)acrylate-based resin.

The epoxy-based functional group can include an epoxy group or a glycidyl group.

When the content of the (meth)acrylate-based repeating units including an epoxy-based functional group in the (meth)acrylate-based resin is too low, the heat resistance and impact resistance of the adhesive film obtained by using the adhesive resin composition for semiconductors may not be sufficient.

The upper limit of the content of the (meth)acrylate-based repeating units including an epoxy-based functional group in the (meth)acrylate-based resin is not particularly restricted. However, in consideration of the elasticity and adhesiveness of the finally prepared adhesive film, the (meth)acrylate-based repeating units having an introduced epoxy-based functional group in the total repeating units of the (meth)acrylate-based resin are preferably included at not more than 35% by weight.

On the other hand, the (meth)acrylate-based resin including more than 17% by weight of the (meth)acrylate-based repeating units containing the epoxy-based functional group may have a glass transition temperature of −10° C. to 20° C., or −5° C. to 15° C.

By using the (meth)acrylate-based resin having the above-described glass transition temperature, the adhesive resin composition for bonding semiconductors may have a sufficient melt flow index, the finally manufactured adhesive film can secure high adhesive strength, and it is possible to easily manufacture in the form of a thin film using the adhesive resin composition for bonding semiconductors.

When the glass transition temperature of the (meth)acrylate-based resin including more than 17% by weight of the (meth)acrylate-based repeating units containing the epoxy-based functional group is too low, the draw ratio of the film at room temperature is greatly increased and thus the preparation of the thin film may be difficult. In addition, the pressure sensitive adhesive force of the adhesive resin composition for bonding semiconductors with respect to the pressure sensitive adhesive layer or the like of the semiconductor element or dicing film applied can increase, thus decreasing pick-up properties.

When the glass transition temperature of the (meth) acrylate-based resin including more than 17% by weight of the (meth)acrylate-based repeating units containing the epoxy-based functional group is too high, the film formed from the resin composition for bonding semiconductors is excessively cured or hardened at room temperature and thus it may not be easy to manufacture a thin film.

On the other hand, in the adhesive resin composition for bonding semiconductors according to the above embodiment, the weight ratio of the (meth)acrylate-based resin may be 0.48 to 0.65 or 0.50 to 0.64 relative to the total weight of the (meth)acrylate-based resin, the epoxy resin, and the phenol resin.

As the weight ratio of the (meth)acrylate-based resin is limited to 0.48 to 0.65 or 0.50 to 0.64 relative to the total weight of the (meth)acrylate-based resin, the epoxy resin, and the phenol resin, the adhesive resin composition for bonding semiconductors according to the above embodiment can, after curing, achieve high adhesive strength with respect to a semiconductor substrate or the like while securing a high modulus.

In the adhesive resin composition for bonding semiconductors according to the embodiment of the invention, when the weight ratio of the (meth)acrylate-based resin is too low relative to the total weight of the (meth)acrylate-based resin, the epoxy resin, and the phenol resin, the adhesive resin composition for bonding semiconductors according to the above embodiment may, after curing, have an excessively increased modulus and decreased adhesive strength with respect to a substrate.

In the adhesive resin composition for bonding semiconductors according to the above embodiment, when the weight ratio of the (meth)acrylate-based resin is too high relative to the total weight of the (meth)acrylate-based resin, the epoxy resin, and the phenol resin, the resin composition for bonding semiconductors according to the above embodiment may, after curing, have a greatly lowered modulus so it is not possible to have sufficient impact resistance in the bonding process, whereby it is not possible to improve chip cracks. Moreover, the melt viscosity at a b-stage is increased and thus void-generating areas increase in the die attach process using the adhesive resin composition for bonding semiconductors and voids remain after curing. Therefore, it is highly likely to inhibit reliability.

The adhesive resin composition for bonding semiconductors may include an epoxy resin and preferably an epoxy resin having a softening point of more than 70° C.

Specifically, the softening point of the epoxy resin may be 70° C. to 120° C.

The epoxy resin enables the adhesive resin composition for bonding semiconductors to have adhesion strength and attachment strength, and the adhesive resin composition for bonding semiconductors forms a crosslinking structure with other components when cured. The finally produced adhesive film can secure a desired physical property, heat resistance, and impact resistance.

Specific examples of the epoxy resin are not limited, but an epoxy resin having one or more functional groups can be used. In particular, the epoxy resin having a softening point of more than 70° C., or between 70° C. and 120° C., can be used.

If the softening point of the epoxy resin is too low, it is difficult for the adhesive resin composition for bonding semiconductors to secure a sufficient modulus at a high temperature after curing, and adhesion strength to a plate has a significant deviation in response to the temperature. Further, the pressure-sensitive adhesive force of the adhesive resin composition for bonding semiconductors increases and the pick-up properties after dicing may be decreased.

The adhesive resin composition for bonding semiconductors may include a phenol resin having a softening point of more than 105° C. or between 105° C. and 150° C. as a curing agent.

By using a phenol resin having a softening point of more than 105° C., the adhesive resin composition for bonding semiconductors may have sufficient heat resistance, strength, and adhesion properties after curing.

If the softening point of the phenol resin is too low, the adhesive resin composition for bonding semiconductors cannot obtain a cured product having sufficient strength after curing.

If the softening point of the phenol resin is too high, the melt flow index of the adhesive resin composition for bonding semiconductors increases and empty voids can be generated inside the adhesive in an actual semiconductor manufacturing process, thereby significantly decreasing the reliability and quality of a final product.

The type of the phenol resin is not particularly limited, but for example, one or more selected from the group consisting of bisphenol A novolac resin having a softening point of 105° C. to 130° C. and biphenyl novolak resin having a softening point of 105° C. to 130° C. can be used.

In the adhesive resin composition for bonding semiconductors, the weight ratio of the phenol resin relative to the epoxy resin is not particularly limited, but in consideration of the equivalent between the epoxy resin and the phenol resin, the weight ratio of the phenol resin relative to the epoxy resin is preferably 0.8 to 1.2.

The adhesive resin composition for bonding semiconductors may further include another curing agent in addition to the phenol resin.

As the curing agent, any conventional curing agent known in the art to be used in the manufacturing of an adhesive film for semiconductors can be used without particular limitation. For example, the curing agent may include one or more selected from the group consisting of an amine-based curing agent, a phenolic curing agent, and an acid anhydride-based curing agent.

The used amount of the curing agent can be properly selected in consideration of the physical properties of the finally manufactured adhesive film, and for example, the curing agent may be used in an amount of 10 to 500 parts by weight or 30 to 300 part by weight based on 100 parts by weight of the epoxy resin.

The adhesive resin composition for bonding semiconductors may further include a curing catalyst.

The curing catalyst serves to promote the function of the curing agent or the curing of the adhesive resin composition for bonding semiconductors, and any conventional curing catalyst known in the art to be used in the manufacturing of the adhesive resin composition for bonding semiconductors or the like can be used without particular limitation.

For example, the curing catalyst used herein may include one or more selected from the group consisting of phosphorus-based compounds, boron-based compounds, phosphorus-boron-based compounds, and imidazole-based compounds.

The used amount of the curing catalyst may be appropriately selected in consideration of the physical properties of the adhesive film finally manufactured, and for example it may be 0.5 to 10 parts by weight based on 100 parts by weight in total of the epoxy resin, the (meth)acrylate-based resin, and the phenol resin.

The adhesive resin composition for bonding semiconductors may further include 0.1 to 50% by weight of an organic solvent.

The content of the organic solvent can be determined in consideration of the physical properties of the resin composition for bonding semiconductors, the physical properties of the finally manufactured adhesive films, or the manufacturing process.

On the other hand, the adhesive resin composition for bonding semiconductors may include not more than 1% by weight, not more than 0.5% by weight, or not more than 0.1% by weight of inorganic particles, and it may not substantially include the inorganic particles.

As the adhesive resin composition for bonding semiconductors includes inorganic particles in a small amount or it does not substantially contain the inorganic particles, a phenomenon of agglomeration of the inorganic particles may not occur in the resin composition and it is possible to increase the mechanical and physical properties or adhesion strength of the adhesive film finally manufactured. Further, it is possible to prevent an appearance damage of the semiconductor or chip combined with the adhesive film, thereby improving the reliability of the manufacturing process of the semiconductor.

Specific examples of the inorganic particle include, but are not limited to, a metal component such as gold, silver, copper, and nickel, or a non-metal component such as alumina, aluminum hydroxide, magnesium hydroxide, calcium carbonate, magnesium carbonate, calcium silicate, magnesium silicate, calcium oxide, magnesium oxide, aluminum oxide, aluminum nitride, silica, boron nitride, titanium dioxide, glass, iron oxide, ceramics, and the like.

After the adhesive resin composition for bonding semiconductors has been cured at 100° C. to 200° C. for 0.2 to 5 h, the melt viscosity measured at 130° C. may be more than 20,000 Pa·s, between 40,000 Pa·s and 300,000 Pa·s, or between 90,000 Pa·s and 200,000 Pa·s.

After the adhesive resin composition for bonding semiconductors has been cured at 100° C. to 200° C. for 0.2 to 5 h, the storage modulus measured at 120° C. may be more than 200 MPa, and the peel strength of the silicon substrate at 50° C. may be more than 40 gf/cm$^2$.

The adhesive resin composition for bonding semiconductors may have a melt viscosity at a b-stage prior to curing of 10,000 Pa·s to 30,000 Pa·s based on 110° C.

On the other hand, according to another embodiment of the invention, an adhesive film for semiconductors may be provided, including: a cross-linking bond between two or more selected from the group consisting of a (meth)acrylate-based resin including more than 17% by weight of (meth)acrylate-based repeating units containing epoxy-based functional groups; an epoxy resin having a softening point of more than 70° C.; and a phenol resin having a softening point of more than 105° C., wherein the weight ratio of the (meth)acrylate-based resin is 0.48 to 0.65 relative to the total weight of the (meth)acrylate-based resin, the epoxy resin, and the phenol resin.

As described above, the adhesive film manufactured by using the adhesive resin composition including: a (meth) acrylate-based resin including more than 17% by weight of (meth)acrylate-based repeating units containing epoxy-based functional groups; an epoxy resin having a softening point of more than 70° C.; and a phenol resin having a softening point of more than 105° C. has excellent impact resistance as well as a high mechanical property and heat resistance, and can also achieve high adhesive strength when used for the bonding of semiconductor devices having a fine thickness.

That is, the adhesive resin composition for bonding semiconductors can be used for the bonding of semiconductors, for the bonding of components included in the semiconductors, or for the bonding of semiconductor packages, can secure high impact resistance when ultra thin wafers are laminated in multi-stages, and can improve electrical properties after manufacturing of the semiconductors.

The adhesive film according to the embodiment of the invention may be a film formed by curing the above-mentioned adhesive resin composition for bonding semiconductors.

The thickness of the adhesive film may be determined depending on the type or characteristics of the semiconductors, chips, element devices, and the like, and for example, it may have a thickness of 1 μm to 100 μm, or 3 μm to 50 μm.

As the above-described adhesive resin composition for bonding semiconductors is cured to form the adhesive film of the embodiment of the invention, the adhesive film may include a cross-linking structure between the components.

Specifically, the adhesive resin composition for bonding semiconductors may include one or more selected among: a cross-linking bond between the (meth)acrylate-based resin including more than 17% by weight of (meth)acrylate-based repeating units containing epoxy-based functional groups and the epoxy resin having a softening point of more than 70° C.; a cross-linking bond between the (meth)acrylate-based resin including more than 17% by weight of (meth) acrylate-based repeating units containing epoxy-based functional groups and the phenol resin having a softening point of more than 70° C.; and a cross-linking bond between the (meth)acrylate-based resin including more than 17% by weight of (meth)acrylate-based repeating units containing epoxy-based functional groups, the epoxy resin having a softening point of more than 70° C., and the phenol resin having a softening point of more than 105° C.

As described above, in the manufacturing of the adhesive film for bonding semiconductors, a curing agent and a curing catalyst may be used.

The adhesive film for semiconductors may further include residual curing agents and curing catalysts.

Each of the curing agent and the curing catalyst may remain in the adhesive film for semiconductors in an amount of 0.5 to 10 parts by weight based on 100 parts by weight in total of the epoxy resin, the (meth)acrylate-based resin, and the phenol resin.

As the manufacturing method of the adhesive film for semiconductors, conventionally known curing methods and manufacturing methods of the film can be used.

For example, the above-mentioned adhesive resin composition for bonding semiconductors can be coated on a predetermined substrate and then dried at a temperature of 50° C. to 150° C. for 1 to 5 min to obtain the adhesive film for semiconductors.

The type of the substrate to which the above-mentioned adhesive resin composition for bonding semiconductors is coated is not particularly limited, and a conventionally known polymer resin substrate, glass substrate, metal substrate, or the like can be used.

Specific examples of the substrate may be a polymer substrate including polyethylene, polypropylene, polyethylene terephthalate, polyurethane, an ethylene-ethyl acrylate copolymer, an ethylene-methyl acrylate copolymer, polybutene, polybutadiene, polymethylpentene, polyvinyl chloride, ethylene vinyl acetate, polystyrene, polycarbonate, or a combination of two or more thereof.

On the other hand, the adhesive film for semiconductors may include not more than 1% by weight, not more than 0.5% by weight, or not more than 0.1% by weight of inorganic particles, and it may not substantially contain the inorganic particles.

As the adhesive resin composition for bonding semiconductors contains the inorganic particles in a small amount or it does not substantially contain the inorganic particles, the mechanical and physical properties or adhesion strength thereof can be improved, and it is possible to prevent appearance damage of the semiconductors or chips bonded with the adhesive film, thereby improving the reliability of the manufacturing process of the semiconductor.

The melt viscosity of the adhesive film for semiconductors measured at 130° C. may be more than 20,000 Pa·s, or between 40,000 Pa·s and 300,000 Pa·s, or between 90,000 Pa·s and 200,000 Pa·s.

The storage modulus of the adhesive film for semiconductors measured at 120° C. may be more than 200 MPa, and the peel strength of the silicon substrate at 50° C. may be more than 40 gf/cm$^2$.

According to a further embodiment of the invention, a dicing die-bonding film may be provided, including: a base film; a pressure-sensitive adhesive layer that is formed on the base film; and an adhesive layer that is formed on the pressure-sensitive adhesive layer and includes the above-described adhesive film for bonding semiconductors.

The type of the base film included in the dicing die-bonding film is not particularly limited, and for example, any conventional plastic film or metal foil and the like known in the art can be used.

For example, the base film may include low-density polyethylene, linear polyethylene, medium density polyethylene, high density polyethylene, ultra low density polyethylene, a random copolymer of polypropylene, a block copolymer of polypropylene, homopolypropylene, polymethylpentene, an ethylene-vinyl acetate copolymer, an ethylene-methacrylic acid copolymer, an ethylene-methylmethacrylate copolymer, an ethylene-ionomer copolymer, an ethylene-vinyl alcohol copolymer, polybutene, a styrene copolymer, or a mixture of two of more thereof.

The base film may include both a film having a structure in which the films including the above-mentioned polymers are laminated in two layers or more, and a film of a single layer including two or more of the above-mentioned polymers.

The thickness of the base film is not particularly limited, and usually the base film is formed in a thickness of 10 μm to 200 μm, and preferably 50 μm to 180 μm.

When the thickness is less than 10 μm, the adjustment of the cutting depth may become unstable in the dicing process. When the thickness is more than 200 μm, many burrs may be generated in the dicing process or a draw ratio may be lowered. Therefore, it is likely that the expanding process will be incorrectly performed.

The base film may be subjected to conventional physical or chemical treatments such as matte treatment, corona discharge treatment, primer treatment, or crosslinking treatment, as needed.

On the other hand, the pressure-sensitive adhesive layer may include a UV (ultraviolet) curable pressure-sensitive adhesive or a heat curable pressure-sensitive adhesive.

When using a UV curable pressure-sensitive adhesive, it is irradiated with UV from the base film to increase the cohesive force and the glass transition temperature of the pressure-sensitive adhesive, thereby lowering its pressure-sensitive force. When using a heat curable pressure-sensitive adhesive, it is heated to lower the pressure-sensitive force.

In addition, the UV curable pressure-sensitive adhesive may include a (meth)acrylate-based resin, a UV curable compound, a photoinitiator, and a crosslinking agent.

The (meth)acrylate-based resin may have a weight average molecular weight of 100,000 to 1,500,000, and preferably 200,000 to 1,000,000.

If the weight average molecular weight is less than 100,000, the coating property or cohesion strength is lowered and thus a phenomenon where some residual material remains on an adherend when peeled off or the pressure-sensitive adhesive is decomposed may occur.

Also, if the weight average molecular weight is more than 1,500,000, the base film may hinder a reaction of the UV curable compound, and thus the reduction of the peel strength may not be performed efficiently.

The (meth)acrylate-based resin may be, for example, a copolymer of a (meth)acrylic acid ester-based monomer and a crosslinking functional group-containing monomer.

Here, examples of the (meth)acrylic acid ester-based monomer may include alkyl(meth)acrylate, and more particularly, a monomer having an alkyl group with 1 to 12 carbon atoms, examples of which may include one or a combination of two or more selected from pentyl(meth)acrylate, n-butyl(meth)acrylate, ethyl(meth)acrylate, methyl(meth)acrylate, hexyl(meth)acrylate, n-octyl(meth)acrylate, isooctyl(meth)acrylate, 2-ethylhexyl(meth)acrylate, dodecyl(meth)acrylate, and dodecyl(meth)acrylate.

As a monomer having the larger number of carbon atoms in the alkyl is used, the glass transition temperature of the final copolymer is lowered, and thus it is sufficient to select the appropriate monomer depending on the glass transition temperature of interest.

In addition, examples of the crosslinking functional group-containing monomer may include one or a combination of two or more selected from a hydroxyl group-containing monomer, a carboxyl-containing monomer, and a nitrogen-containing monomer.

In this case, examples of the hydroxyl group-containing compound may include, but are not limited to, 2-hydroxyethyl(meth)acrylate, 2-hydroxypropyl(meth)acrylate, and the like, examples of the carboxyl group-containing compound may include, but are not limited to, (meth)acrylic acid and the like, and examples of the nitrogen-containing monomer may include, but are not limited to, (meth)acrylonitrile, N-vinylpyrrolidone, N-vinylcaprolactam, and the like.

The (meth)acrylate-based resin may additionally include a low molecular weight compound containing a carbon-carbon double bond, such as vinyl acetate, styrene, or (meth)acrylonitrile, from the standpoint of the improvement of other functionalities such as compatibility.

Further, the type of the UV curable compound is not particularly limited, and for example, multifunctional compounds having a weight average molecular weight of about 500 to about 300,000 (e.g., a multifunctional urethane acrylate, a multifunctional acrylate monomer or oligomer, etc.) may be used.

It will be apparent to those skilled in the art that an oligomer suitable for a desired use can be easily selected.

The UV curable compound may be contained in an amount of 5 to 400 parts by weight, and preferably 10 to 200 parts by weight, relative to 100 parts by weight of the base resin.

If the content of the UV-curable compound is less than 5 parts by weight, the pick-up properties may be reduced because the reduction in the pressure-sensitive adhesive force is not sufficient after curing. If the content of the UV-curable compound is more than 400 parts by weight, the cohesive force of the pressure-sensitive adhesive agent may become insufficient before the UV light is irradiated, or release from, for example, a release film, may not be easily achieved.

The type of photoinitiator is also not particularly limited, and common initiators known in the art can be used. The content of the photoinitiator may be 0.05 to 20 parts by weight, relative to 100 parts by weight of the UV curable compound.

If the content of the photoinitiator is less than 0.05 parts by weight, the pick-up properties may be reduced because the curing reaction by the UV irradiation is insufficient. If the content of the photoinitiator is more than 20 parts by weight, the crosslinking reaction may occur in a short unit in the curring process, an unreactive UV curable compound may be generated whereby residual materials remains on the surface of the adherend, or the peel strength after curing may be excessively lowered, thereby decreasing the pick-up properties.

Further, the type of the crosslinking agent included in the pressure-sensitive adhesive part and endowing the adhesive strength and cohesive force is not particularly limited. As the crosslinking agent, a typical compound such as an isocyanate-based compound, an aziridine-based compound, an epoxy-based compound, or a metal chelate-based compound can be used.

The crosslinking agent may be contained in an amount of 2 to 40 parts by weight, and preferably 2 to 20 parts by weight, relative to 100 parts by weight of the base resin.

If the content of the crosslinking agent is less than 2 parts by weight, the cohesive force of the pressure-sensitive adhesive agent may become insufficient. If the content of the crosslinking agent is more than 20 parts by weight, the chips may be scattered due to a shortage of the pressure sensitive adhesive force before the UV light is irradiated.

The pressure-sensitive adhesive layer may further include a tackifying agent such as a rosin resin, a terpene resin, a phenol resin, a styrene resin, an aliphatic petroleum resin, an aromatic petroleum resin, or an aliphatic petroleum resin, and an aliphatic-aromatic copolymer petroleum resin.

The method of forming a pressure-sensitive adhesive layer including the components as described above on a base film is not particularly limited, and for example, a method of coating the pressure-sensitive adhesive composition of the present invention on the base film to form a pressure-sensitive adhesive layer, or a method of coating the adhesive composition on a releasable substrate to prepare a pressure-sensitive adhesive layer and transferring a pressure-sensitive adhesive layer on the base film using the releasable substrate, can be used.

In this case, the method of coating and drying the pressure-sensitive adhesive composition is not particularly limited, and for example, a method of coating a composition containing the respective components as they stand, or diluting the composition in a suitable solvent and coating it, by using a comma coater, a gravure coater, a die coater, or a reverse coater, and then drying the solvent at a temperature of 60° C. to 200° C. for 10 s to 30 min.

Further, the above process may further include an aging process for performing a sufficient crosslinking reaction of the pressure-sensitive adhesive.

The thickness of the pressure-sensitive adhesive layer is not particularly limited, but for example, it may be in a range of 10 μm to 500 μm.

On the other hand, as described above, the adhesive layer may be formed on the pressure-sensitive adhesive layer and include an adhesive film for semiconductors of the above-described embodiment.

The content related to the adhesive film for semiconductor includes all of the above-mentioned contents.

The thickness of the adhesive layer is not particularly limited, but for example, it may be in the range of 1 μm to 100 μm, or 3 μm to 50 μm.

The dicing die bonding film may also further include a release film formed on the adhesive layer.

Examples of the release film which can be used in the present invention include one or more plastic films selected from the group consisting of a polyethylene terephthalate film, a polytetrafluoroethylene film, a polyethylene film, a polypropylene film, a polybutene film, a polybutadiene film, a vinyl chloride copolymer film, a polyimide film, and the like.

The surface of the release film as described above may be subjected to a release treatment with one or more alkyd-based, silicone-based, fluorine-based, unsaturated ester-based, polyolefin-based, or wax-based release agents. Among them, an alkyd-based, silicone-based, or fluorine-based release agent having heat resistance is particularly preferred.

The release film may be usually formed at a thickness of about 10 μm to about 500 μm, preferably about 20 μm to about 200 μm, but it is not limited thereto.

Method for producing the above-mentioned dicing die-bonding film is not particularly limited, and for example, a method of sequentially forming a pressure-sensitive adhesive part, an adhesive part, and a release film on a base film, or a method of separately preparing a release film in which a dicing film (base film+pressure-sensitive adhesive part) and a die-bonding film or an adhesive part are formed, and laminating it, or the like, can be used.

The laminating method is not particularly limited, and for example, a hot roll laminating method or a laminate pressing method can be used. Among them, in terms of continuous process possibility and efficiency, the hot roll laminating method is preferable.

The hot roll laminating method may be performed at a temperature of 10° C. to 100° C. under a pressure of 0.1 Kgf/cm$^2$ to 10 Kgf/cm$^2$, but is not limited thereto.

On the other hand, according to a further embodiment of the invention, a semiconductor wafer in which an adhesive layer of the dicing die bonding film is attached to one surface of the wafer and the base film of the dicing die bonding film is fixed to a wafer ring frame may be provided.

The above-described semiconductor wafer can be manufactured by attaching (laminating) an adhesive part of the dicing die bonding film to a back side of the semiconductor wafer at a temperature of 0° C. to 180° C. and fixing the base film to the wafer ring frame.

In addition, according to a further embodiment of the invention, a semiconductor device is provided, including: a wiring board; an adhesive layer formed on a chip mounting surface of the wiring board and including the above-described adhesive film for semiconductors; and a semiconductor chip mounted on the adhesive layer.

The semiconductor device as described above can be prepared through the following processes.

That is, the semiconductor wafer to which the aforementioned dicing die bonding film is attached is completely cut using a dicing apparatus and divided into individual chips.

Subsequently, the pressure-sensitive adhesive part is cured through means of applying UV light or heat.

For the pressure-sensitive adhesive cured by UV light or heat as described above, a close adhesion force of the adhesive is reduced, so that chips are easily picked up in the subsequent process.

In this case, if necessary, an expanding process of expanding the dicing die bonding film is performed to determine intervals between chips and occur interface distortion between the adhesive part and the pressure-sensitive adhesive part, thereby facilitating the pick-up.

When the pick-up of chips is performed in the above state, the semiconductor wafer and the adhesive part are released from the pressure-sensitive adhesive part, so it is possible to obtain the chips to which only the adhesive layer is attached.

The chips to which the adhesive layer is attached are attached to the semiconductor substrate.

Typically, the chip is attached under the conditions of a temperature of 100° C. to 180° C., a time of 0.5 s to 3 s, and a pressure of 0.5 kgf/cm$^2$ to 2 kgf/cm$^2$.

After the process is performed, the wire bonding and molding processes are performed and thereby the semiconductor device is obtained.

According to the present invention, particularly, by optimizing the strength or the like of the adhesive agent for the die bonding, even though the pre-curing process after the die bonding process is not performed, the release, shifting, or deflection of chips can be inhibited in the wire bonding or molding process.

The method for manufacturing the semiconductor device is not limited to these processes, and it may further include an optional process or a change in sequence of the processes.

For example, the process can be performed in the sequence of UV curing→dicing→expanding, or in the sequence of dicing→expanding→UV curing.

After the chip attaching process, a heating or cooling process can be additionally performed.

In addition, according to a further embodiment of the invention, a dicing method for semiconductor wafer is provided, including: a pretreatment step of completely dividing or partially dividing the semiconductor wafer including the dicing die-bonding film, and a wafer laminated on at least one surface of the dicing die-bonding film; a step of expanding the semiconductor wafer after the pretreatment step; and a step of irradiating ultraviolet light to a base film of the expanded semiconductor wafer and picking up the individual chips separated by dividing the semiconductor wafer.

The content related to the dicing die-bonding film includes all of the above-mentioned contents.

Except for the content related to the detailed procedure of the above dicing method, devices, methods, or the like used in the dicing method of semiconductor wafer typically known in the art can be used without particular limitation.

By using the dicing die-bonding film including the dicing film, the occurrence of burrs during the dicing process of the semiconductor wafer is minimized, thereby preventing contamination of semiconductor chips and improving the reliability and lifetime of semiconductor chips.

Advantageous Effects

According to the present invention, an adhesive resin composition for bonding semiconductors and an adhesive film for semiconductors, capable of having excellent impact resistance with a high mechanical property and thermal resistance and also achieving high adhesive strength when used for the bonding of semiconductor devices having a fine thickness, can be provided.

Also, according to the present invention, a dicing die bonding film, capable of having excellent impact resistance with a high mechanical property and thermal resistance, achieving high adhesive strength when used for the bonding of a semiconductor device having a fine thickness, minimizing the occurrence of burrs during the dicing step of the semiconductor wafer, thereby preventing contamination of semiconductor chips, and improving the reliability and lifetime of semiconductor chips, and a dicing method for the semiconductor wafer using a dicing die bonding film, can be provided.

The adhesive resin composition for bonding semiconductors can provide an adhesive film for bonding semiconductors and an adhesive film for semiconductor packages capable of being used for the bonding of semiconductors, for the bonding of components included in a semiconductor, or for a semiconductor package, securing high impact resistance when ultra thin wafers are laminated in multi-stages, and improving electrical properties after manufacturing of the semiconductor.

DETAILED DESCRIPTION OF THE EMBODIMENTS

Below, the embodiment of present invention will be described in more detail with reference to the following examples. However, these examples are provided only for illustration of the present invention, and should not be construed as limiting the present invention.

Examples 1 to 5 and Comparative Examples 1 to 3: Preparation of an Adhesive Resin Composition for Bonding Semiconductors and an Adhesive Film for Semiconductors (1) Preparation of an Adhesive Resin Composition Solution for Bonding Semiconductors The components shown in Tables 1 and 2 below were dissolved in methyl ethyl ketone to obtain an adhesive resin composition for bonding semiconductors.

(2) Preparation of an Adhesive Film for Semiconductors

The manufactured adhesive resin composition solution for bonding semiconductors was coated on a polyethylene terephthalate film (thickness: 38 μm) which was subjected to a silicone release treatment, and then dried at 130° C. for 2 min to obtain an adhesive film with a thickness of 38 μm.

TABLE 1

| [Unit: g] | | Example 1 | Example 2 | Example 3 | Example 4 | Example 5 | Comparative Example 1 | Comparative Example 2 |
|---|---|---|---|---|---|---|---|---|
| Phenol resin (a) | KH-6021 (BPA nov) | 102 | 102 | 102 | 115 | 102 | 80 | 102 |

TABLE 1-continued

| [Unit: g] | | Example 1 | Example 2 | Example 3 | Example 4 | Example 5 | Comparative Example 1 | Comparative Example 2 |
|---|---|---|---|---|---|---|---|---|
| Epoxy resin (b) | EOCN-104S (cresol nov) | 92 | 92 | 92 | 120 | 92 | 100 | 92 |
| Acryl-based resin (c) | KG-3038 (Negami) | | | | | | 293 | |
| | KG-3040 (Negami) | 300 | | | | | | |
| | KG-3043 (Negami) | | 300 | 350 | 300 | 350 | | |
| | KG-3036 (Negami) | | | | | | | 300 |
| | c/(a + b + c) | 0.60 | 0.60 | 0.64 | 0.56 | 0.64 | 0.61 | 0.60 |
| Curing promoter | DICY (TCI) | 5 | 5 | 5 | 5 | 5 | 5 | 5 |
| | 2MA-OK (Curesol) | 5 | 5 | 5 | 5 | 5 | 5 | 5 |
| Additive | A-1160 (GE Silquest) | 3 | 3 | 3 | 3 | 3 | 3 | 3 |

TABLE 2

| [Unit: g] | | Comparative Example 3 | Comparative Example 4 | Comparative Example 5 | Comparative Example 6 | Comparative Example 7 |
|---|---|---|---|---|---|---|
| Phenol resin (a) | KH-6021 (BPA nov) | 102 | 102 | 102 | | 67 |
| | GPH-103 | | | | 132 | |
| Epoxy resin (b) | EOCN-104S (cresol nov) | 92 | 92 | 120 | 92 | |
| | YD-011 | | | | | 127 |
| Acryl-based resin (c) | KG-3038 (Negami) | | | | | |
| | KG-3040 (Negami) | | | | | |
| | KG-3043 (Negami) | 170 | 400 | 500 | 300 | 300 |
| | KG-3036 (Negami) | | | | | |
| | c/(a + b + c) | 0.47 | 0.67 | 0.69 | 0.57 | 0.60 |
| Curing promoter | DICY (TCI) | 5 | 5 | 5 | 5 | 5 |
| | 2MA-OK (Curesol) | 5 | 5 | 5 | 5 | 5 |
| Additive | A-1160 (GE Silquest) | 3 | 3 | 3 | 3 | 3 |

KH-6021: Bisphenol A novolac resin (manufactured by DIC Corp., softening point: about 125° C.)

GPH-103: Biphenyl aralkyl phenol resin (manufactured by Nippon Kayaku, softening point: 103° C., OH equivalent: 231 g/eq)

EOCN-104S: Cresol novolac epoxy (equivalent: 180 g/eq, softening point: about 90° C.)

YD-011: Bisphenol A epoxy resin (equivalent: 450 g/eq, softening point: about 60° C.)

KG-3038: Acrylic acid ester polymer (manufactured by Negami, glycidyl methacrylate-based repeating units: 15 wt %, glass transition temperature: 10° C.)

KG-3040: Acrylic acid ester polymer (manufactured by Negami, glycidyl methacrylate-based repeating units: 18 wt %, glass transition temperature: 14° C.)

KG-3043: Acrylic acid ester polymer (manufactured by Negami, glycidyl methacrylate-based repeating units: 21 wt %, glass transition temperature: −1.8° C.)

KG-3036: Acrylic acid ester polymer (manufactured by Negami, glycidyl methacrylate-based repeating units: 10 wt %, glass transition temperature: 14° C.)

Curing agent and curing catalyst DICY 2MA-OK A-1160 GE Silquest (versatile amino-functional coupling agent): Silane, Gamma-Ureidopropyltrialkoxysilane in alcohol (50 wt %)

Experimental Example: Evaluation of Physical Properties of an Adhesive Film for Semiconductors Experimental Example 1: Measurement of Tensile Storage Modulus after Heat Curing of the Adhesive Film for Semiconductors The adhesive films obtained in the examples and comparative examples were overlapped and laminated using a roll laminatior at 60° C. until the thickness reached 720 μm, and then heat-cured at a temperature of 150° C. for 1 h.

The heat-cured product was cut to prepare a hexahedral specimen with a width of 5.3 mm and a length of 30 mm.

The tensile storage modulus of the specimen at −30° C. to 280° C. was measured under conditions of a frequency of 10 Hz and a heating rate of 10° C./min using viscoelasticity measurement equipment (DMA Q800, TA Instruments, Inc.)

The measurement results are shown in Table 3 below.

Experimental Example 2: Evaluation of Adhesive Strength with Respect to Silicone Substrate of an Adhesive Film for Semiconductors (1) Preparation of a Dicing Film 75 g of 2-ethylhexyl acrylate, 10 g of 2-ethylhexyl methacrylate, and 15 g of 2-hydroxyethyl acrylate were copolymerized in 300 g of ethyl acrylate to obtain a copolymer with a weight average molecular weight of 850,000 (glass transition temperature of 10° C.), to which 10 g of an acrylic isocyanate compound as a photocurable material was added to obtain a reaction product. Subsequently, 10 g of a multifunctional isocyanate oligomer and 1 g of Darocur TPO as a photoinitiator were mixed to obtain a UV curable pressure-sensitive adhesive composition.

The UV curable pressure-sensitive adhesive composition was coated onto a 38 μm thick polyester film which had been subjected to release treatment, so as to have a thickness of 20 μm after being dried, and was dried at 110° C. for 3 min.

Then, the dried pressure-sensitive adhesive layer was laminated on a polyolefin film as a base film having a thickness of 100 μm to prepare a dicing film.

(2) Measurement of Peel Strength and Wettability of Wafer

The pressure-sensitive adhesive layer obtained in the above process, and the adhesive film (width 18 mm, length 10 cm) obtained in the examples and comparative examples, were laminated to prepare an adhesive film with a multilayer structure for the dicing die bonding, which was placed and mounted on a semiconductor chip with a thickness of 500 μm located in a hot plate.

Then, the dicing film-adhesive film-semiconductor chip composite was exposed at room temperature for about 3 h, and then the peel strength thereof was measured under temperature conditions shown in Table 1 below to evaluate the adhesive strength with regard to the silicon substrate of the adhesive film for semiconductors.

Subsequently, the wettability of the silicone substrate of the adhesive film for semiconductors was visually measured and then evaluated by the criteria described below.

◯: good close adhesion to the wafer, no residual void

Δ: good close adhesion to the wafer, and residual void of 5% or more relative to total area X: close adhesion to the wafer, but residual void of 10% or more relative to total area

TABLE 3

|  | Temperature | Example 1 | Example 2 | Example 3 | Example 4 | Example 5 |
|---|---|---|---|---|---|---|
| Experimental Example 1 [Storage modulus 1 h cure@ 150° C. (MPa)] | 120° C. | 200 | 224 | 255 | 355 | 255 |
|  | 130° C. | 168 | 178 | 177 | 262 | 177 |
|  | 140° C. | 121 | 134 | 120 | 207 | 120 |
| Experimental Example 2-1 [peel (gf/25 mm) strength @ temp] | 50° C. | 55 | 60 | 66 | 59 | 66 |
|  | 70° C. | 95 | 100 | 120 | 110 | 120 |
| Experimental Example 2-2 [wetting property @ temp] | 50° C. | ◯ | ◯ | ◯ | ◯ | ◯ |
|  | 70° C. | ◯ | ◯ | ◯ | ◯ | ◯ |

TABLE 4

|  | Temperature | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Experimental Example 1 [Storage modulus 1 h cure@ 150° C. (MPa)] | 120° C. | 100 | 36 | 418 | 121 | 61 | 272 | 98 |
|  | 130° C. | 74 | 27 | 346 | 100 | 53 | 201 | 82 |
|  | 140° C. | 56 | 22 | 281 | 83 | 44 | 144 | 67 |
| Experimental Example 2-1 [peel (gf/25 mm) strength @ temp] | 50° C. | 63 | 45 | 35 | 86 | 103 | 48 | 87 |
|  | 70° C. | 125 | 83 | 53 | 137 | 200 | 95 | 400 |
| Experimental Example 2-2 [wetting property @ temp] | 50° C. | ◯ | Δ | Δ | ◯ | ◯ | Δ | ◯ |
|  | 70° C. | ◯ | Δ | Δ | ◯ | ◯ | Δ | ◯ |

As shown in Tables 3 and 4 above, it was confirmed that, after the adhesive films for semiconductors obtained in Examples 1 to 5 were heat-cured, they exhibited a high tensile storage modulus at 120° C. to 140° C. in which gold wire bonding was performed, thereby minimizing damage of chips due to the impact applied to the semiconductor chips during the gold wire bonding process. In addition, the present adhesive films not only had high heat resistance and mechanical physical properties but also high adhesive strength to a semiconductor material such as a silicon substrate. Further, the present adhesive films could minimize the warpage of thin wafer chips.

Further, the adhesive films obtained in Examples 1 to 5 had high close adhesion force with wafers even before they were cured, and thus the generation of voids could be minimized during the dia attachment process and also the warpage of thin wafer chips could be minimized during the above process.

In contrast, as shown in Table 4 above, after the adhesive films for semiconductors obtained in Comparative Examples 1, 2, and 5 to 7 were heat-cured, they exhibited a low tensile storage modulus at 120° C. to 140° C. in which gold wire bonding was performed, and thereby the impact resistance with respect to the impact applied to a semiconductor chip during the gold wire bonding process was low, which may cause damage of chips.

Experimental Example 3: Melt Viscosity at a High Temperature of the Adhesive Film for Semiconductors The adhesive films obtained in the examples and comparative examples were overlapped and laminated to a thickness of 720 μm at 60° C. and then cut into a circular shape with a size of 8 mm to prepare a specimen for measurement.

The viscosity of the specimen in the b-stage was measured while adding a shear of 5 rad and a force of 350 g using a rheometer of TA Instruments (Model name: ARES G2) and raising the temperature at a rate of 20° C./min.

At this time, the melt viscosity at 110° C. was measured.

The same adhesive film was heat-cured at a temperature of 150° C. for 1 h.

Then, the heat-cured product was cut into a circular shape with a size of 8 mm to prepare a specimen for measurement.

The viscosity of the specimen in the b-stage was measured while adding a shear of 5 rad and a force of 350 g using a rheometer of TA Instruments (Model name: ARES G2) and raising the temperature at a rate of 20° C./min.

At this time, the melt viscosity at 150° C. was measured.

TABLE 5

| Melt viscosity | Temperature | Example 1 | Example 2 | Example 3 | Example 4 | Example 5 |
| --- | --- | --- | --- | --- | --- | --- |
| Before curing | 110° C. | 17,500 | 17,000 | 20,000 | 15,000 | 20,000 |
| After curing | 150° C. | 138,000 | 134,500 | 137,800 | 138,000 | 137,800 |

TABLE 6

| Melt viscosity | Temperature | Comparative Example 1 | Comparative Example 2 | Comparative Example 3 | Comparative Example 4 | Comparative Example 5 | Comparative Example 6 | Comparative Example 7 |
| --- | --- | --- | --- | --- | --- | --- | --- | --- |
| Before curing | 110° C. | 9,500 | 22,000 | 23,000 | 15,240 | 15,000 | 15,300 | 15,000 |
| After curing | 150° C. | 92,500 | 146,000 | 149,000 | 92,500 | 139,000 | 125,000 | 75,000 |

Further, the adhesive films obtained in Comparative Examples 3 and 4 had a low close adhesion force with wafers before and after curing, and thereby voids were formed during the dia attach process, which may cause a reduction in the reliability later.

In particular, it was confirmed that the adhesive film of Comparative Example 3 prepared from the resin composition wherein the weight ratio of the (meth)acrylate-based resin was 0.47 relative to the total weight of the (meth)acrylate-based resin, the epoxy resin, and the phenol resin exhibited a high tensile storage modulus at 120° C. to 140° C., but the close adhesion power with the wafer was greatly lowered.

Further, it was confirmed that the adhesive films of Comparative Examples 4 and 5 prepared from the resin compositions wherein the weight ratio of the (meth)acrylate-based resin were 0.67 and 0.69 relative to the total weight of the (meth)acrylate-based resin, the epoxy resin, and the phenol resin exhibited a low tensile storage modulus. Therefore, when using the adhesive films of Comparative Examples 4 and 5, the impact resistance with respect to the impact applied to semiconductor chips during the gold wire bonding process was low, which may cause damage of chips.

As shown in Tables 5 and 6 above, it was confirmed that the adhesive resin compositions for bonding semiconductors obtained in the examples had a relatively low melt viscosity before curing, for example a melt viscosity of not more than 20,000 Pa·s based on 110° C., and thereby the generation of voids could be minimized during the dia attach process, and they also had a relatively high melt viscosity after curing, for example, a melt viscosity of 125,000 Pa·s to 140,000 Pa·s based on 150° C., and thereby a high curing degree, a high mechanical physical property, and heat resistance could be achieved.

In contrast, it was confirmed that the adhesive resin compositions for bonding semiconductors obtained in the comparative examples had a relatively high melt viscosity before curing (Comparative Examples 2, 3), or did not have a sufficiently high melt viscosity after curing (Comparative Examples 1, 4, and 7).

What is claims:

1. An adhesive resin composition for bonding semiconductors, comprising:
    a (meth)acrylate-based resin including more than 17% by weight of (meth)acrylate-based repeating units containing epoxy-based functional groups;

an epoxy resin having a softening point of more than 70° C.; and a phenol resin having a softening point of more than 105° C., wherein a weight ratio of the (meth)acrylate-based resin is 0.48 to 0.65 relative to a total weight of the (meth)acrylate-based resin, the epoxy resin, and the phenol resin.

2. The adhesive resin composition for bonding semiconductors according to claim 1, wherein the (meth)acrylate-based resin including more than 17% by weight of (meth)acrylate-based repeating units containing epoxy-based functional groups has a glass transition temperature of −10° C. to 20° C.

3. The adhesive resin composition for bonding semiconductors according to claim 1, wherein the (meth)acrylate-based resin includes 17% to 35% by weight of (meth)acrylate-based repeating units containing epoxy-based functional groups.

4. The adhesive resin composition for bonding semiconductors according to claim 1, wherein the (meth)acrylate-based resin including more than 17% by weight of (meth)acrylate-based repeating units containing epoxy-based functional groups is a (meth)acrylic acid ester polymer including more than 17% by weight of (meth)acrylate-based repeating units containing epoxy-based functional groups.

5. The adhesive resin composition for bonding semiconductors according to claim 1, wherein a softening point of the epoxy resin is 70° C. to 120° C.

6. The adhesive resin composition for bonding semiconductors according to claim 1, wherein a softening point of the phenol resin is 105° C. to 150° C.

7. The adhesive resin composition for bonding semiconductors according to claim 1, wherein the phenol resin includes one or more selected from the group consisting of bisphenol A novolac resin having a softening point of 105° C. to 130° C. and biphenyl novolak resin having a softening point of 105° C. to 130° C.

8. The adhesive resin composition for bonding semiconductors according to claim 1, wherein the weight ratio of the phenol resin relative to the epoxy resin is 0.8 to 1.2.

9. The adhesive resin composition for bonding semiconductors according to claim 1, further comprising a curing agent and a curing catalyst.

10. The adhesive resin composition for bonding semiconductors according to claim 9, wherein the curing agent includes one or more selected from the group consisting of an amine-based curing agent, a phenolic curing agent, and an acid anhydride-based curing agent, and the curing catalyst includes one or more selected from the group consisting of phosphorus-based compounds, boron-based compounds, phosphorus-boron-based compounds, and imidazole-based compounds.

11. The adhesive resin composition for bonding semiconductors according to claim 1, wherein the content of an inorganic particle in the adhesive resin composition for bonding semiconductors is not more than 1% by weight.

12. The adhesive resin composition for bonding semiconductors according to claim 1, wherein after the adhesive resin composition for bonding semiconductors has been cured at 100° C. to 200° C. for 0.2 to 5 h, the melt viscosity measured at 130° C. may be more than 20,000 Pa·s.

13. The adhesive resin composition for bonding semiconductors according to claim 1, wherein after the adhesive resin composition for bonding semiconductors has been cured at 100° C. to 200° C. for 0.2 to 5 h, the storage modulus measured at 120° C. is more than 200 MPa, and the peel strength of the silicon substrate at 50° C. is more than 40 gf/cm².

14. The adhesive resin composition for bonding semiconductors according to claim 1, wherein the adhesive resin composition for bonding semiconductors has a melt viscosity at a b-stage prior to curing of 10,000 Pa·s to 30,000 Pa·s based on 110° C.

15. An adhesive film for semiconductors, comprising: a cross-linking bond between a) a phenol resin having a softening point of more than 105° C. and a (meth)acrylate-based resin including more than 17% by weight of (meth)acrylate-based repeating units containing epoxy-based functional groups; or b) a phenol resin having a softening point of more than 105° C., a (meth)acrylate-based resin including more than 17% by weight of (meth)acrylate-based repeating units containing epoxy-based functional groups and an epoxy resin having a softening point of more than 70° C., wherein the weight ratio of the (meth)acrylate-based resin is 0.48 to 0.65 relative to the total weight of the (meth)acrylate-based resin, the epoxy resin, and the phenol resin.

16. The adhesive film for semiconductors according to claim 15, wherein the total content of inorganic particles remaining in the adhesive film for semiconductors is not more than 1% by weight.

17. The adhesive film for semiconductors according to claim 15, wherein the melt viscosity of the adhesive film for semiconductors measured at 130° C. is more than 20,000 Pa·s.

18. The adhesive film for semiconductors according to claim 15, wherein the storage modulus of the adhesive film for semiconductors measured at 120° C. is more than 200 MPa, and the peel strength of the silicon substrate at 50° C. is more than 40 gf/cm².

19. A dicing die-bonding film comprising: a base film; a pressure-sensitive adhesive layer that is formed on the base film; and an adhesive layer that is formed on the pressure-sensitive adhesive layer and includes the adhesive film for semiconductors of claim 15.

20. The dicing die-bonding film according to claim 19, wherein the pressure-sensitive adhesive layer includes a UV (ultraviolet) curable pressure-sensitive adhesive or a heat curable pressure-sensitive adhesive.

* * * * *